US009332671B2

(12) United States Patent
Schult et al.

(10) Patent No.: US 9,332,671 B2
(45) Date of Patent: May 3, 2016

(54) HEAT DISSIPATION OF POWER ELECTRONICS OF A COOLING UNIT

(71) Applicant: AIRBUS OPERATIONS GMBH, Hamburg (DE)

(72) Inventors: Jens Schult, Hamburg (DE); Torsten Trümper, Hamburg (DE)

(73) Assignee: AIRBUS OPERATIONS GMBH, Hamburg (DE)

( * ) Notice: Subject to any disclaimer, the term of this patent is extended or adjusted under 35 U.S.C. 154(b) by 163 days.

(21) Appl. No.: 13/863,014

(22) Filed: Apr. 15, 2013

(65) Prior Publication Data

US 2013/0271915 A1 Oct. 17, 2013

Related U.S. Application Data

(60) Provisional application No. 61/625,114, filed on Apr. 17, 2012.

(30) Foreign Application Priority Data

Apr. 17, 2012 (EP) .................................... 10164452

(51) Int. Cl.
*G06F 1/20* (2006.01)
*H05K 5/00* (2006.01)
*H05K 7/20* (2006.01)
(Continued)

(52) U.S. Cl.
CPC ...... *H05K 7/20* (2013.01); *B64D 13/00* (2013.01); *F25B 31/006* (2013.01); *H05K 7/2089* (2013.01); *H05K 7/20336* (2013.01); *H05K 7/20909* (2013.01); *B64D 2013/0614* (2013.01)

(58) Field of Classification Search
CPC ...... B64D 11/04; B64D 13/06; B64D 13/006; F25B 1/00; F28D 15/00; F28D 15/02; H05K 7/20
USPC ............... 361/679.46–679.53, 689, 699–702; 62/56, 79, 126, 239, 244, 259.2, 407, 62/454; 165/104.11, 104.21, 104.33
See application file for complete search history.

(56) References Cited

U.S. PATENT DOCUMENTS 5,513,500 A 5/1996 Fischer
7,213,391 B2 5/2007 Jones
(Continued)

FOREIGN PATENT DOCUMENTS

DE 43 40 317 6/1995
DE 10 2006 005 035 9/2007
(Continued)

*Primary Examiner* — Courtney Smith
*Assistant Examiner* — Zhengfu Feng
(74) *Attorney, Agent, or Firm* — Dickinson Wright PLLC

(57) ABSTRACT

A cooling unit in a transport unit includes power electronics; a heat exchanger for thermally coupling a cooling agent of a central cooling system of the transport unit with air of the cooling unit to cool one or more generating devices; and a heat pipe for heat dissipation of the power electronics. At a first portion of the heat pipe, at least some of a working agent is in the liquid phase and, at a second portion of the heat pipe, at least some of the working agent is in the gas phase. In the first portion of the heat pipe, heat from the power electronics is absorbed by evaporating the working agent in the liquid phase. In the second portion of the heat pipe, heat is released to the cooling agent by condensing the working agent in the gas phase.

15 Claims, 4 Drawing Sheets

(51) Int. Cl.
*F25D 3/12* (2006.01)
*F25B 7/00* (2006.01)
*F25B 49/00* (2006.01)
*F28D 15/00* (2006.01)
*F25B 31/00* (2006.01)
*B64D 13/00* (2006.01)
*B64D 13/06* (2006.01)

(56) References Cited

U.S. PATENT DOCUMENTS

| | | | |
|---|---|---|---|
| 7,505,267 | B2 | 3/2009 | Sarno |
| 7,967,249 | B2 | 6/2011 | Mühlthaler |
| 2007/0044451 | A1* | 3/2007 | Jones ................. F28D 15/02 |
| | | | 60/226.1 |
| 2009/0000329 | A1 | 1/2009 | Colberg |
| 2010/0044016 | A1* | 2/2010 | Frey et al. ................. 165/104.33 |
| 2010/0071881 | A1* | 3/2010 | Murer et al. ............. 165/104.33 |
| 2010/0097765 | A1* | 4/2010 | Suzuki et al. ................. 361/699 |
| 2010/0251737 | A1* | 10/2010 | Roering ........................... 62/115 |
| 2014/0076522 | A1* | 3/2014 | Olesen et al. ............. 165/104.21 |

FOREIGN PATENT DOCUMENTS

| | | |
|---|---|---|
| DE | 10 2009 011 797 | 9/2010 |
| WO | 2007/088012 | 8/2007 |

* cited by examiner

HEAT DISSIPATION OF POWER ELECTRONICS OF A COOLING UNIT

CROSS REFERENCE TO RELATED APPLICATIONS

This application is entitled to and claims the benefit of European Application No. EP 12 164 452.0 filed Apr. 17, 2012 and U.S. Provisional Application No. 61/625,114, filed Apr. 17, 2012, the disclosures of each of which, including the specification, claims, drawings and abstract, are incorporated herein by reference in their entirety.

FIELD

The present invention relates to cooling unit for one or more heat generating devices provided on board of a means of transport, for example on board of an aircraft, the use of the cooling unit, a cooling system comprising the cooling unit and a means of transport, for example an aircraft, comprising the cooling unit.

BACKGROUND

Cooling systems are normally provided on board of a means of transport, for example on board of aircrafts, ships, trains or busses, in order to properly cool components arranged on or carried on board of the means of transport. These components may include components that require preservation, e.g. food, and components which generate heat while operated, like heat generating devices, e.g. electrical or electronic devices and electrical or electronic components.

A cooling system for cooling food on board of an aircraft is, for example, described in DE 43 40 317 A1 and U.S. Pat. No. 5,513,500. The food with which the passengers are to be provided is typically kept in mobile transport containers. These transport containers are equipped and pre-cooled outside of the aircraft and, after being loaded onto the aircraft, set down at appropriate deposit locations in the aircraft passenger compartment, for example in the on-board kitchens. In order to ensure that the food remains fresh until it is distributed to the passengers, cooling stations are provided in the region of the transport container deposit locations, these stations being supplied with cooling energy by a central chiller device and this cooling energy being delivered to the transport containers with the food stored therein. The central chiller device is thermally coupled to the individual cooling stations via a cooling circuit. The cooling circuit comprises a feed line as well as a withdrawal line in which a refrigerant is circulated. The feed line connects the central chiller device to the individual cooling stations in order to feed refrigerant cooled to an appropriately low temperature by the central chiller device and therefore cooling energy to the cooling stations. Refrigerant which has been heated through the delivery of cooling energy to the cooling stations is returned from the cooling stations to the central chiller device via the withdrawal line.

Another cooling system for cooling e.g. food on board of an aircraft is disclosed in DE 10 2006 005 035 B3 and WO 2007/088012 A1. This cooling system comprises a chiller device and a first cooling circuit which is adapted to feed cooling energy generated by the chiller device to at least one cooling station. The chiller device comprises a second cooling circuit which is formed separately from the first cooling circuit and is thermally coupled to the first cooling circuit.

DE 10 2009 011 797 A1 and US 2010/0251737 A1 also describe a cooling system for cooling e.g. food on board of an aircraft. The cooling system comprises a refrigerating device and a cooling circuit. The cooling circuit is devised to supply cooling energy produced by the refrigerating device to at least one cooling station. The refrigerant circulating in the cooling circuit is so selected that upon release of its cooling energy to the at least one cooling station it is convertible from the liquid to the gaseous state and is then convertible back to the liquid state by means of corresponding pressure and temperature control in the cooling circuit.

In known cooling systems (which are also sometimes named supplemental cooling systems) the used cooling agent (also sometimes referred to as refrigerant or cooling fluid to explicitly indicate that a fluid is used) is often cooled down to a low temperature lower than 0° C., e.g. to a temperature of about −9° C. The cooling agent is then supplied to the cooling stations by means of one or more cooling circuits. In case of aircrafts, the cooling stations for cooling the food are often referred to as cooling units or Air Cooling Units (also sometimes referred to as Air Chilling Units) (ACUs). For cooling food the ACUs are normally distributed in on-board kitchens, which are cooled regions.

Heat generating devices, like electronic devices, e.g. electronic devices of the In Flight Entertainment (IFE) system of an aircraft, are normally arranged outside the cooled on-board kitchen regions or other chilled regions. The outer temperature around the means of transport, like an aircraft, can sometimes rise up to 60° C. in hot areas, which also leads to high temperatures at uncooled regions of the means of transport, e.g. the aircraft. Thus, simply providing the ACUs used for cooling food also for cooling other heat generating devices leads to the problem that the power electronics of the ACU generates heat in operation and, in order to prevent the ACU from overheating, the power of the ACU has to be reduced to a lower level.

Known techniques for heat dissipation of the power electronics by means of cooling fins cannot be applied because of the limited space inside the ACUs and the small temperature difference between the outside of the ACUs and the maximally allowed temperature inside the ACUs, which normally lies around 90° C.

It has been conceived to cool said power electronics by means of cold plates, i.e. elements supplied with the cooling agent (cooling fluid) of the supplemental cooling system. If such cold plates are brought into contact with the power electronics, e.g. if the power semiconductors are arranged on the cold plates, the cooling fluid which is supplied at a (very) low temperature, e.g. about −9° C., would cool components or elements of the power electronics down to a temperature below the dew point of the ambient air of the power electronics. This can lead to short-circuits, electric arcs or sparks or other undesirable phenomena in the power electronics.

SUMMARY

It is an object of the present invention to provide a compact and reliable technique for cooling one or more heat generating devices provided on board of a means of transport, for example on board of an aircraft.

This object is solved by a cooling unit according to attached claims, the use of the cooling unit according to attached claims, a cooling system according to attached claims comprising the cooling unit and a means of transport according to attached claims comprising the cooling unit. Preferred embodiments are respectively defined by the dependent claims.

According to a first aspect, a cooling unit for cooling one or more heat generating, devices provided on board of a means of transport, for example on board of an aircraft, is provided.

The cooling unit comprises power electronics, a heat exchanger and a heat pipe. The power electronics is adapted to provide the cooling unit with electric power. The heat exchanger is adapted to thermally couple a cooling agent supplied by a central cooling system provided on board of the means of transport with air supplied in and/or into the cooling unit in order to cool the air by means of the cooling agent to thereby provide cooling energy in the form of cold air to the one or more generating devices. The heat pipe is adapted to dissipate heat of the power electronics. At a first portion of the heat pipe, at least some of a working agent contained inside the heat pipe is in the liquid phase and, at a second portion of the heat pipe, at least some of the working agent contained inside the heat pipe is in the gas phase. The first portion of the heat pipe is thermally coupled with the power electronics such that heat from the power electronics is absorbed by evaporating the working agent being in the liquid phase and the second portion of the heat pipe is thermally coupled with the cooling agent such that heat is released to the cooling agent by condensing the working agent being in the gas phase.

In other words, the first portion of the heat pipe may be arranged in the cooling unit in heat-conducting connection with the power electronics of the cooling unit such that heat from the power electronics is absorbed by evaporating the working agent being in the liquid phase (the liquid phase is also sometimes named liquid state). Further, the second portion of the heat pipe may be arranged in the cooling unit in heat-conducting connection with the cooling agent such that heat is released to the cooling agent by condensing the working agent being in the gas phase (the gas phase is also sometimes named gaseous state). The heat generating device may be any component, group of components or device generating heat when operated. For example, the heat generating device may be any electric or electronic device suitable to be operated on board of a means of transport, e.g. on board of an aircraft. For example, the heat generating device may be an electronic component or electronic device forming part of the In Flight Entertainment (IFE) system provided on board of an aircraft. The power electronics may comprise one or more electronic components like transistors (e.g. Insulated Gate Bipolar Transistors (IGBTs)), Thyristors and individual chips.

The first portion of the heat pipe may be referred to as a hot interface, hot portion or evaporator section of the heat pipe. Likewise, the second portion of the heat pipe may be referred to as a cold interface, cold portion or condenser section of the heat pipe. The first portion may comprise or be a first end (or hot end) of the heat pipe and the second portion may comprise or be a second end (or cold end) of the heat pipe. In this context, the term hot implies that the hot interface or hot portion is thermally coupled with a warm component (e.g. at least warmer than the temperature required for evaporating the working agent), i.e. the heat generating device, so that heat is absorbed from the warm component, rather than that said portion of the heat pipe is hot. Likewise, the term cold implies that the cold interface or cold portion is thermally coupled with a cold component (e.g. at least colder than the temperature required for condensing the working agent), i.e. the cooling agent, so that heat is released to the cold component, rather than that said portion of the heat pipe is cold.

The hot interface (first portion) may be at a (very) low pressure, e.g. at least lower than that of the other portion (second portion) of the heat pipe. At the first portion, the working agent being in the liquid phase turns into a vapor by absorbing heat from the power electronics. In other words, when said first portion of the heat pipe is heated, the working agent being in the liquid phase (working fluid) inside the heat pipe evaporates and increases the vapor pressure inside the cavity of the heat pipe. The latent heat of evaporation absorbed by the vaporization of the working agent in the liquid phase (working fluid) reduces the temperature at the first portion (hot interface or hot end) of the heat pipe and thereby reduces the temperature of the power electronics. As the vapor pressure at the first portion is higher than the vapor pressure at the second portion, the pressure difference drives the vaporized working agent to transfer to the second portion. At the second portion (cold interface), the vapor condenses back into a liquid and thereby releases its latent heat to the cooling agent in the cooling circuit, which is thereby warmed.

Since heat generated by the power electronics is dissipated by means of the heat pipe, the cooling unit can operate at higher power without overheating. The heat pipe is a compact device. Thus, a compact cooling unit for cooling the one or more heat generating devices is provided. Further, the heat pipe is a highly effective heat transfer device having good thermal conductivity properties. Thus, a reliable cooling unit for cooling the one or more heat generating devices is provided.

According to one possible realization of the cooling unit according to the first aspect, the cooling unit may further comprise a fan unit for supplying the air in the cooling unit. If no fan is provided, the air may be supplied from the outside to the cooling unit. The heat exchanger may be adapted to bring the cooling agent into thermal contact with the air supplied in and/or into the cooling unit, e.g. supplied by the fan unit, in order to cool the air by means of the cooling agent. The cooling agent may be generated by a central chiller device e.g. as described in DE 10 2006 005 035 B3 and WO 2007/088012 A1. The cooling agent may be supplied by a central cooling system (supplemental cooling system) provided on board of the means of transport, e.g. on board of the aircraft, as described in DE 10 2006 005 035 B3 and WO 2007/088012 A1 as well as DE 10 2009 011 797 A1 and US 2010/0251737 A1 which are hereby incorporated by reference. The cooling agent may be cooled down to a temperature under 0° C., e.g. to about −9° C.

The second portion of the heat pipe may be thermally coupled to a supply line arranged in the cooling unit coupled with the central cooling system for supplying the cooling agent from the central cooling system to the heat exchanger. Alternatively or additionally, the second portion of the heat pipe may be thermally coupled to a discharge line arranged in the cooling unit (also sometimes referred to as return line or withdrawal line) coupled with the central cooling system for returning the cooling agent from the heat exchanger to the central cooling system.

The first portion of the heat pipe may be in direct or indirect contact with a casing of the power electronics to absorb the heat from the power electronics. The casing of the power electronics may comprise metal or any other heat conducting material. For example the casing may be a metallic casing.

In accordance with a second realization of the first aspect, which may/may not be combined with the first realization of the first aspect, the heat pipe may have a sealed casing. The working agent may be contained within the sealed casing at a predetermined pressure which is lower than atmospheric pressure such that a predetermined temperature at which heat from the power electronics is absorbed by evaporating the working agent being in the liquid phase is lower than the normal boiling point of the working agent being in the liquid phase at atmospheric pressure. The predetermined pressure may be set such that the temperature of the power electronics remains above the dew point of the ambient air of the power electronics. In this way, phenomena like short-circuits or electric arcs or sparks can be efficiently prevented and the reliability of the cooling unit can be even more increased.

The heat pipe may comprise the casing (which could also be called a container), the working agent (or working fluid) and a capillary structure (also sometimes referred to as wick). The container may be adapted to isolate the working agent (working fluid) from the outside environment. The container may be leak-proof, while at the same time may enable transfer of heat to take place from and into the working agent (working fluid). The working agent (working fluid) may be selected in accordance with the intended operating vapor temperature range. Within the approximate temperature band, several possible working agents may be used. A variety of characteristics may be considered in order to determine the preferred working agent for the application considered. These characteristics may include without limitation good thermal stability, the vapor pressure being not too high or low over the operating pressure, temperature range, high latent heat, high thermal conductivity, acceptable freezing or pour point and so in. A high latent heat of vaporization may be desirable in order to transfer large amounts of heat with minimum fluid flow, and hence to maintain low pressure drops within the heat pipe. The thermal conductivity of the working fluid may be set high in order to minimize the radial temperature gradient. The capillary structure may be a porous structure made of materials like steel, aluminum, nickel or copper in various ranges of pore sizes. The prime purpose of the capillary structure in the heat pipe is to generate capillary pressure to transport the working fluid from the second portion (condenser section) to the first portion (evaporator section). The capillary structure may be adapted to distribute the liquid around the evaporator section to any area where heat is likely to be received by the heat pipe. The selection of the capillary structure for the heat pipe may depend on many factors, several of which being closely linked to the properties of the working fluid. For example, the permeability normally increases with increasing pore size. The heat transport capability of the heat pipe is generally raised by increasing the thickness of the capillary structure. The overall thermal resistance at the evaporator section also depends on the conductivity of the working fluid in the capillary structure.

In accordance with one specific exemplary configuration of the second realization of the first aspect, the heat pipe may be formed as an evacuated cylindrical vessel with the internal walls lined with a capillary structure or wick that is saturated with a working fluid. According to this specific exemplary configuration, the heat pipe may initially be evacuated and then charged with the working fluid prior to being sealed. In this way, the internal pressure may be set by the vapor pressure of the fluid. When heat is input to the evaporator section, liquid in the capillary structure is vaporized, creating a pressure gradient in the vapor core. Such pressure gradient forces the vapor to flow along the pipe to the cooling region where it condenses releasing its latent heat of evaporation, which is rejected to the surrounding by a heat sink (the cooling agent). The liquid then returns to the evaporator region through the pores in the capillary structure by the action of capillary pressure produced by the small pores of the capillary structure. As a result, heat is absorbed at one end of the heat pipe and rejected to the other. The working fluid serves as a heat transport medium. The heat input region of the heat pipe may be called evaporator section and the cooling region may be called condenser section because the working fluid is being vaporized or condensed. In between the evaporator and condenser sections, there may be an adiabatic region.

The heat pipe may be configured such that the working agent is selectively adjustable (changeable) so as to change the predetermined temperature. Alternatively or additionally, the predetermined pressure may be selectively adjustable so as to change the predetermined temperature, e.g. to a lower or to a higher level. In other words, a different working agent may be used instead of a previously or initially used working agent so as to change the predetermined temperature. Alternatively or additionally, the heat pipe may be set to a different pressure than the initially or previously set pressure so as to change the predetermined temperature.

For example, the working agent and/or the pressure may be initially so selected that the predetermined temperature, at which heat from the power electronics is absorbed, is at a first temperature level. The working agent and/or the pressure may afterwards be changed such that the predetermined temperature is at a second temperature level, which is either higher or lower than the first temperature level.

The working agent may comprise any coolant suitable for operating in the heat pipe. For example, the working agent may comprise water, ethanol, acetone, sodium and/or mercury. It is also conceivable that the working agent is water, ethanol, acetone, sodium or mercury.

The heat pipe may be hollow with the space inside at least nearly evacuated. In this way, the state of the agent (liquid) inside may be altered between the liquid state and the gaseous state. Inside the heat pipe there may be a small quantity of water, e.g. purified water. At normal atmospheric pressure water boils at 100° C., but with decreased air pressure the boiling temperature will be less than 100° C. This is due to the difference in air pressure. In other words, the boiling point of the liquid inside the heat pipe may be altered. For example, in case of (purified) water the boiling point may also be set to about 30° C. depending on the pressure. In this case, when the heat pipe is heated above 30° C. the water vaporizes. This vapor (rapidly) travels to the cold interface (e.g., a second end) of the heat pipe thereby transferring heat. As the heat is lost at the cold interface (condenser portion), the vapor condenses to form a liquid (water) and returns to the first portion (e.g., the first end) of the heat pipe to once again repeat the process.

When water is used as the working agent, the predetermined pressure may be set to any level between 0 bar and 1 bar. In one possible configuration of the second realization, the working agent is water and the predetermined pressure is set to 0.0234 bar such that the predetermined temperature at which heat from the power electronics is absorbed by evaporating the working agent being in the liquid phase is equal to or higher than 20° C. In other words, the predetermined temperature at which heat from the power electronics is absorbed by evaporating the working agent being in the liquid phase is equal to or higher than 20° C., when the predetermined pressure is set to 0.0234 bar. By adjusting the predetermined pressure between 0 bar and 1 bar, the boiling temperature of the working agent can be adjusted, e.g. in case of water between 0° C. and 100° C. depending on the operating conditions, like the heat generating devices to be cooled by the cooling unit, the load of the power electronics, the outer temperature outside the cooling unit or outside the means of transport and so on.

For example, water may be used as the working agent initially. The predetermined pressure may be set to about 0.2 bar so that the predetermined temperature is about 60° C. In dependence on the operating conditions, e.g. dependent on the temperature around the means of transport, the working agent and/or the predetermined pressure may be changed. For example, water may still be used as the working agent, but the predetermined pressure may be set to about 0.0234 bar so that the predetermined temperature becomes about 20° C.

In this way, it can be ensured that the heat pipe only absorbs heat from the power electronics, if the power electronics is above a predetermined threshold. In other words, it can be ensured that, if the power electronics is not warmer than the predetermined threshold, no heat is absorbed and the power electronics is not cooled down to a temperature lower than the predetermined threshold, e.g. not lower than the dew point of the ambient air of the power electronics.

The heat pipe may be a Variable Conductance Heat Pipe (VCHP). Alternatively, the heat pipe may be a Pressure Controlled Heat Pipe (PCHP) which is an actively controlled VCHP. Both the VCHP and the PHCP allow to vary the thermal conductance of the heat pipe. In case of an aircraft as the means of transport, the cooling unit may be an Air Cooling Unit (Air Chilling Unit) (ACU) additionally comprising the heat pipe as described herein.

According to a second aspect, the use of the cooling unit as described herein for cooling one or more heat generating devices provided on board of a means of transport, for example on board of an aircraft, is provided.

According to a third aspect, a cooling system for a means of transport, for example an aircraft, is provided. The cooling system comprises at least one cooling unit, e.g. a plurality of cooling units, as described herein for cooling one or more, e.g. a plurality of, heat generating devices provided on board of the means of transport, at least one cooling station, e.g. a plurality of cooling stations, different from the at least one cooling unit for cooling food provided on board of the means of transport, and a central chiller device for generating cooling energy, wherein the chiller device is thermally coupled with the at least one cooling unit and the at least one cooling station to supply the cooling energy to the at least one cooling unit and to the at least one cooling station.

The cooling system may further comprise a first cooling circuit which is thermally coupled to the chiller device to supply the cooling energy to the at least one cooling unit and to the at least one cooling station.

According to a fourth aspect, a means of transport, for example an aircraft, comprising the cooling unit as described herein for cooling one or more heat generating devices provided on board of the means of transport, for example on board of the aircraft, is provided. In accordance with one possible variant of the fourth aspect, the means of transport may comprise the cooling system according to the third aspect.

The means of transport may be an aircraft. In this case, the cooling unit may be arranged on board of the aircraft such that the cooling energy in the form of cold air is supplied to IFE electronic components. For example, the cooling unit may be arranged at a rack carrying the IFE electronic components.

Even if some of the above aspects have been described herein with respect to the heat pipe or the cooling unit, these aspects may also be implemented as a method or may also refer to the use of the cooling unit, the cooling system and the means of transport. Similarly, aspects described as or with respect to a method may be realized by means of suitable units in the cooling unit.

BRIEF DESCRIPTION OF THE DRAWINGS

In the following, the present invention will further be described with reference to exemplary embodiments illustrated in the figures, in which.

DETAILED DESCRIPTION OF EMBODIMENTS

In the following description, for purposes of explanation and not limitation, specific details are set forth, such as specific arrangements of specific components in order to provide a thorough understanding of the present invention. It will be apparent to one skilled in the art that the present invention may be practiced in other embodiments that depart from these specific details. For example, the skilled person will appreciate that the present invention may be practiced with other working agents different from water discussed below and at different pressure levels discussed below to illustrate the present invention. While the exemplary embodiments described below are described with respect to aircrafts as an example for a means of transport for which the present invention is applicable, the skilled person would understand that the present invention is also applicable to other means of transports like ships, busses, trains or the like.

Figure 1:
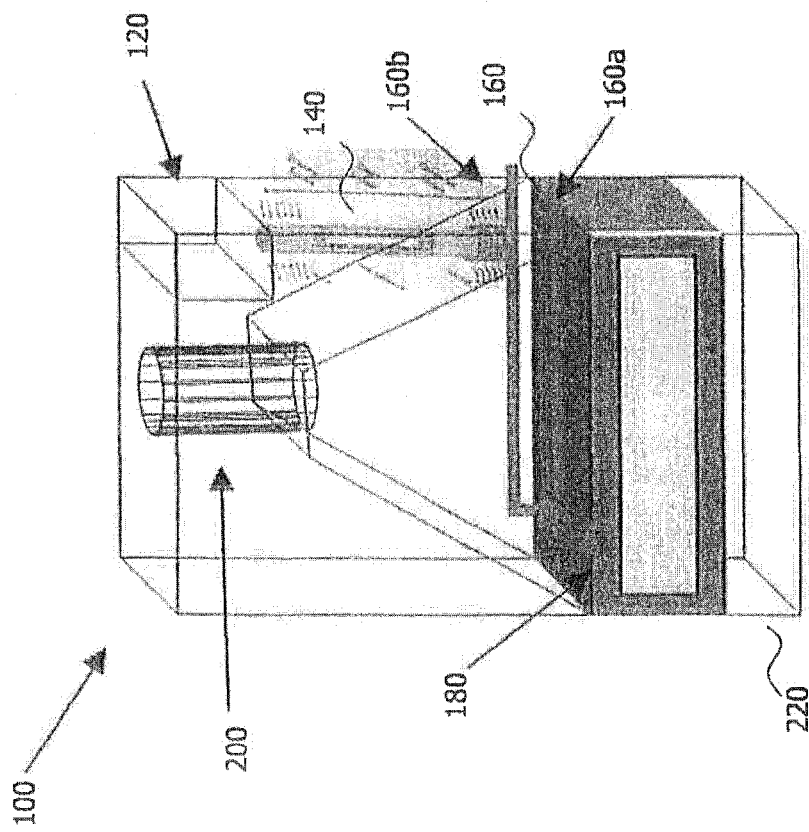
FIG. 1 schematically illustrates an embodiment of a cooling unit.

FIG. 1 schematically illustrates a cooling unit 100 according to an embodiment of the present invention. The cooling unit 100, which is in the following exemplarily and without limitation referred to as an Air Cooling Unit (ACU), comprises power electronics 120 for providing power to/for the ACU 100, a cooling circuit 160, a heat exchanger 180 and a fan 200. Further, a heat pipe 140 is arranged in the ACU 100 which is used for heat dissipation of the power electronics 120.

As further schematically illustrated in FIG. 1, the heat pipe 140 is thermally coupled with the power electronics 120 and the cooling circuit 160. In the exemplary configuration of FIG. 1, a first end of the heat pipe 140 (in FIG. 1, the upper end) is thermally coupled to the power electronics 120 and a second end of the heat pipe (in FIG. 1, the lower end) is thermally coupled to a return line 160b of the cooling circuit 160. However, other configurations are conceivable in which e.g. the second end of the heat pipe 140 (cold interface) is coupled with the supply line 160a of the cooling circuit 160. In the specific exemplary configuration of FIG. 1, the first end (hot interface) of the heat pipe 140 is in direct contact with a metallic casing or metallic box around the power electronics 120. The cooling circuit 160 is coupled with the heat exchanger 180 so that the cooling agent circulating through the cooling circuit 160 can flow through the heat exchanger 180. Further, the fan 200 is arranged such that the air supplied by the fan 200 is directed to the heat exchanger 180 thereby blowing the air through the heat exchanger 180 onto a heat generating device 220 which is exemplarily arranged in FIG. 1 next to the heat exchanger 180. Instead of using the fan 200, air can be provided from the outside of the ACU 100 into the ACU 100 and can be directed onto the heat exchanger 180.

A working agent is contained in the heat pipe 140. In the following, it is exemplarily assumed without limitation that water is contained in the heat pipe 140 as the working agent. At the hot interface of the heat pipe 140 (which is in contact with the power electronics 120), at least some of the water is in the liquid phase and at the cold interface (which is in contact with the cooling circuit 160) at least some of the water is in the gas phase. The water is contained within the heat pipe 140 at a predetermined pressure. Depending on the predetermined pressure, the water can be boiled at a different boiling temperature. The relationship between pressure and boiling temperature of water is schematically given in FIG. 2 (showing pressure p over temperature teta).

Figure 2:
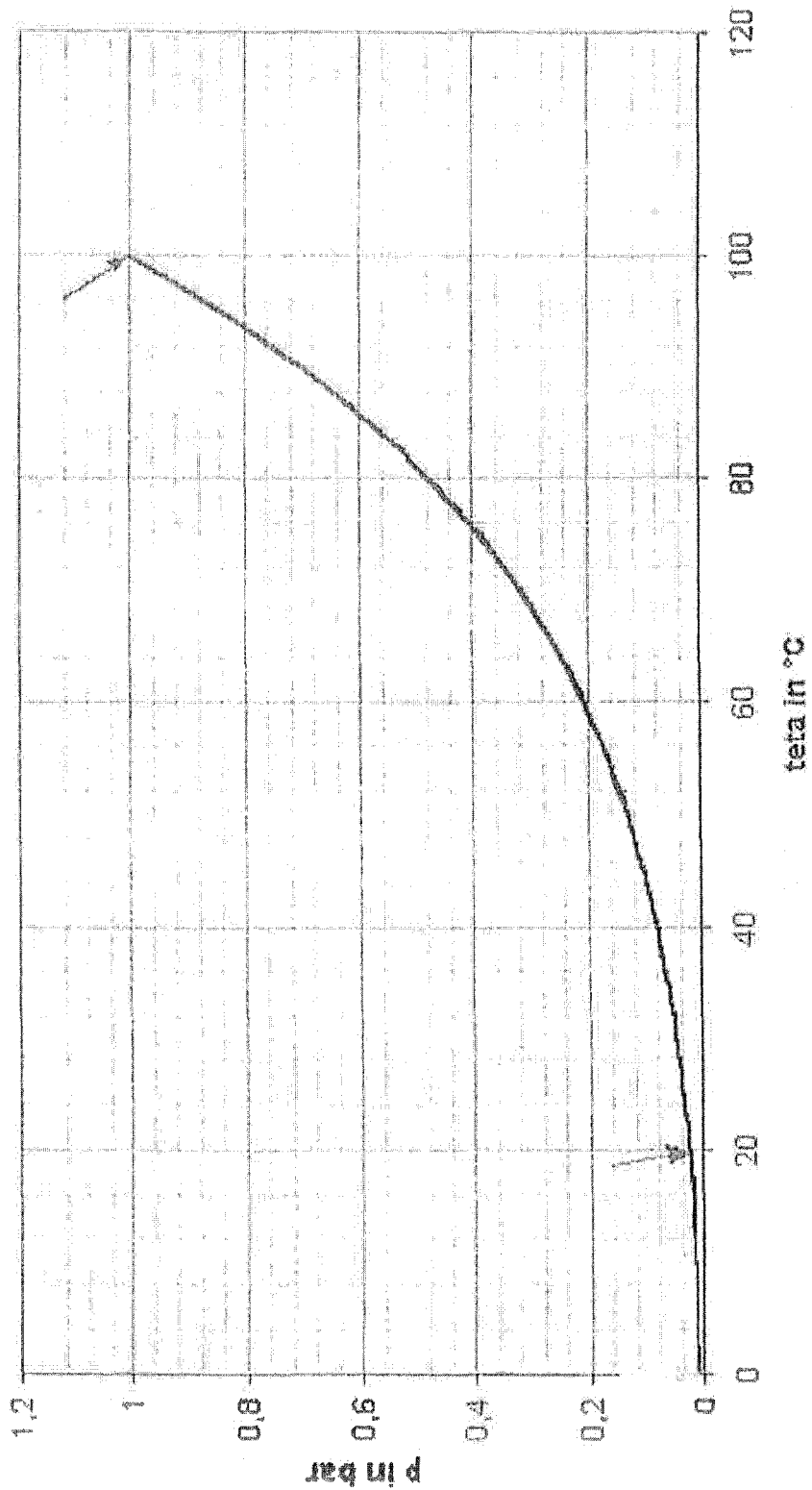
FIG. 2 schematically illustrates a temperature-pressure-chart of water.

As can be seen from FIG. 2, the higher the predetermined pressure is the higher the boiling temperature is. While a pressure of 1 bar (which is a close approximation to atmospheric pressure) leads to a boiling temperature of about 100° C., a pressure of 0.0234 bar leads to a boiling temperature of 20° C. Thus, at a predetermined pressure of 0.0234 bar, water cannot perform a phase change below 20° C., but only at or above 20° C.

Figure 3:
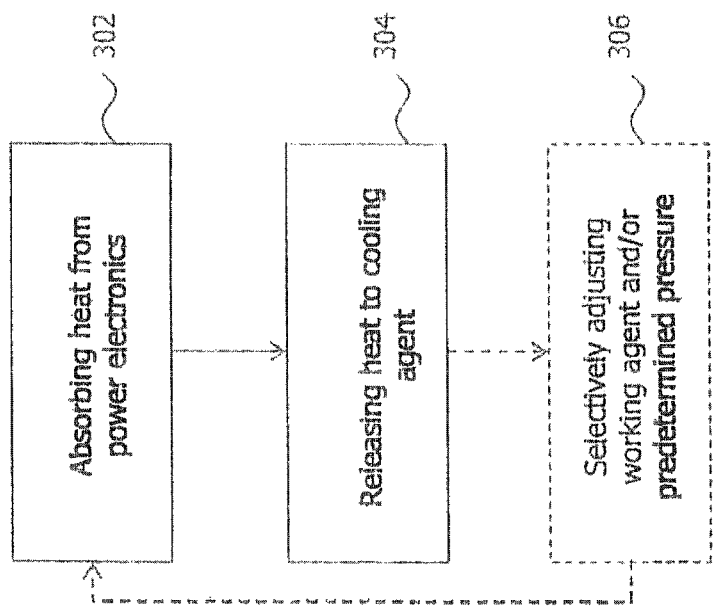
FIG. 3 schematically illustrates a possible operation of the cooling unit of FIG. 1.

The operation of the cooling unit of FIG. 1 is now further explained with respect to FIG. 3. As can be seen from the dashed lines in FIG. 3, the step 306 may be performed but may also be omitted.

In the following, it is assumed that the heat pipe 140 is arranged as shown in FIG. 1. That is, the first end of the heat pipe (in FIG. 1 the upper end (hot interface)) is thermally coupled with the power electronics 120 and the second portion of the heat pipe 140 (in FIG. 1 the lower end (cold interface)), is thermally coupled with the cooling agent circulating through the cooling circuit 160. When the power electronics 120 is operated in order to provide the cooling unit with the necessary power (energy) for cooling the heat generating device 220, the power electronics (continuously) produces heat. The pressure in the heat pipe 140 is initially set to a predetermined pressure, e.g. to 0.2 bar. When water is used as the working agent, a phase change can only be affected when the temperature of the working agent is above 60° C. (see FIG. 2). Thus, the heat pipe 140 absorbs heat from the power electronics 120 when the temperature of the working agent is above 60° C. (see step 302). The working agent absorbing the heat is vaporized and the resulting vapor transfers to the cold interface (lower end in FIG. 1) of the heat, pipe 140. At the cold interface, the working agent being in the gas phase condenses and thereby releases heat to the cooling agent of the cooling circuit 160 (see step 304). The condensed working agent flows back to the upper end of the heat pipe 140. In order to enable the working agent to flow back to the upper end, a capillary structure is exemplarily provided in the heat pipe 140. It would, however, for example, be conceivable that the location of the power electronics 120 and the cooling circuit 160 is swapped so as to also swap the orientation of the heat pipe 140. The condensed working agent can then flow back from the upper end to the lower end of the heat pipe without the need of any capillary structure but only due to gravity.

In addition to steps 302 to 304, it is conceivable to selectively adjust the working agent and/or the predetermined pressure in step 306. For example, water may still be used as the working agent, but the pressure may be changed to, e.g. 0.0234 bar. In consequence, heat is only absorbed from the power electronics, if the temperature of the working agent is at least 20° C. (see FIG. 2). In this way, it is prevented that the power electronics is cooled down lower than a temperature at which short-circuits or the like can arise, but at the same time the power electronics can be operated at (nearly) full power. Steps 302 and 304 can then be repeated at the adjusted pressure until the working agent is changed and/or the pressure is adjusted once more in step 306.

Figure 4:
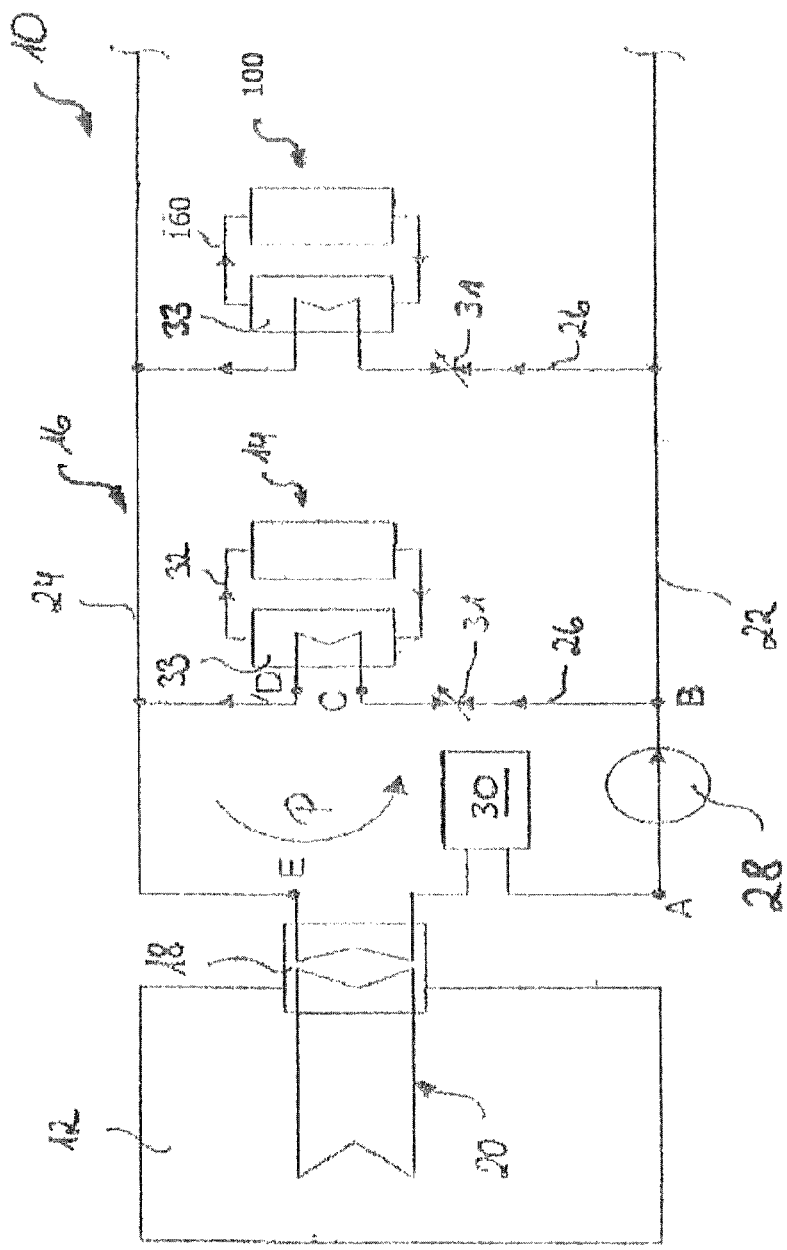
FIG. 4 schematically illustrates an embodiment of a cooling system comprising the cooling unit of FIG. 1.

FIG. 4 schematically illustrates an embodiment of a cooling system comprising the cooling unit of FIG. 1. The configuration of the cooling system of FIG. 4 is based on the structure of the cooling system disclosed in DE 10 2006 005 035 B3 and WO 2007/088012 A1 which is hereby incorporated by reference.

FIG. 4 shows a cooling system 10 which is provided to cool food provided on board a passenger aircraft for distribution to the passengers and stored in mobile transport containers and to cool heat generating devices provided on board of the aircraft. In the following it is assumed without limitation that the heat generating devices are electronic devices of the IFE system of the aircraft. The cooling system 10 comprises a central chiller device 12, a plurality of cooling stations 14 (by way of example only one cooling station 14 is shown in FIG. 4) which are distributed in the region of the on-board kitchens at respective deposit locations of the transport containers in the passenger compartment of the aircraft as well as a plurality of cooling units 100 of FIG. 1 (by way of example only one cooling unit 100 is shown in FIG. 4) which are distributed at or in the region of the IFE rack at which the IFE devices of the aircraft's IFE system are arranged. In order to supply the cooling stations 14 and the cooling units 100 with cooling energy, a first cooling circuit 16 is provided, through which a first refrigerant (first cooling agent), as indicated by the arrow P, flows anticlockwise. By way of example but without limitation it is assumed in the following that $CO_2$ is used as the first refrigerant (first cooling agent).

The first cooling circuit 16 of the cooling system 10 is thermally coupled to a second cooling circuit 20 of the chiller device 12 via a first heat exchanger 18. The first cooling circuit 16 comprises a feed line 22, a withdrawal line 24 as well as a plurality of branch lines 26, the branch lines 26 in each case serving to connect the individual cooling stations 14 and cooling units 100 to the feed or the withdrawal line 22, 24 of the first cooling circuit 16.

A first delivery device 28, which is in the form of a pump, is disposed in the feed line 22 of the first cooling circuit 16 and serves to deliver the first refrigerant from a first reservoir 30, which is disposed upstream of the delivery device 28 in the first cooling circuit 16, and to circulate it in the first cooling circuit 16. The first reservoir 30 is provided with appropriate insulation, so that the first refrigerant which is temporarily stored in the first reservoir 30 can be maintained at the desired low temperature.

A throttle valve 31 is disposed in each branch line 26 connecting the feed line 22 of the first cooling circuit 16 to the individual cooling stations 14 and the individual cooling units 100, which valve 31 serves to control the flow rate of the first refrigerant in the direction of each cooling station 14 and of each cooling unit 100 as well as the pressure in the first refrigerant upstream of each cooling station 14 and of each cooling unit 100. If required, each throttle valve 31 is capable of completely interrupting the flow of the first refrigerant through the corresponding branch line 26 and therefore stopping the feed of the first refrigerant to the cooling station 14 or the cooling unit 100 disposed downstream of the throttle valve 31. Individual cooling stations 14 and cooling units 100 can thereby be isolated from the first cooling circuit 16 in a simple manner, while other cooling stations 14 and cooling units 100 continue to be fed with cooling energy.

Each cooling station 14 has a third cooling circuit 32 which is formed separately from the first cooling circuit 16 and is thermally coupled to the first cooling circuit 16 via a heat exchanger 33. Likewise, each cooling unit 100 has a fourth cooling circuit 160 (in the exemplary configuration of FIG. 4, the cooling circuit 160 shown in FIG. 1 is used) which is formed separately from the first cooling circuit 16 and is thermally coupled to the first cooling circuit 16 via a heat exchanger 33. The third cooling circuit 32 and the fourth cooling circuit 160 may be different from each other or may have the same configuration. The heat exchanger 33 is formed as an evaporation device, so that the first refrigerant flowing through the first cooling circuit 16 is converted from the liquid to the gaseous state when its cooling energy is delivered to the cooling station 14 and the cooling unit 100. After emerging from the heat exchanger 33, the first refrigerant is returned to the liquid state again through appropriate temperature and pressure control in the first cooling circuit 16.

In this way, both food and electronic devices, like electronic devices of the IFE system, provided on board a passenger aircraft can be cooled by means of the same cooling system 10. The cooling stations 14 for cooling the food and the cooling units 100 for cooling the electronic devices just have to be arranged in different regions of the aircraft. For example, the cooling stations 14 and the cooling units 100 may have a similar structure and may only differ in that the cooling units 100 additionally contain the heat pipe 140 as described herein.

It is believed that many advantages of the present invention will be fully understood from the foregoing description, and will be apparent that various changes may be made in the form, construction and arrangement of the exemplary aspects thereof without departing form the scope of the invention or without sacrificing all of its advantages. Because the invention can be varied in many ways, it will be recognized that the invention should be limited only by the scope of the following claims.

The invention claimed is:

1. A cooling unit for cooling one or more heat generating devices provided on board of a means of transport, the cooling unit comprising:
   power electronics for providing the cooling unit with electric power,
   a heat exchanger for thermally coupling a cooling agent supplied by a central cooling system provided on board of the means of transport with air supplied in and/or into the cooling unit in order to cool the air by means of the cooling agent to thereby provide cooling energy in the form of cold air to the one or more heat generating devices, and
   a heat pipe for heat dissipation of the power electronics, wherein, at a first portion of the heat pipe, at least some of a working agent contained inside the heat pipe is in the liquid phase and, at a second portion of the heat pipe, at least some of the working agent contained inside the heat pipe is in the gas phase, wherein the first portion of the heat pipe is thermally coupled with the power electronics such that heat from the power electronics is absorbed by evaporating the working agent being in the liquid phase and wherein the second portion of the heat pipe is thermally coupled with the cooling agent such that heat is released to the cooling agent by condensing the working agent being in the gas phase.

2. The cooling unit according to claim 1, wherein the cooling unit further comprises a fan unit for supplying the air in the cooling unit.

3. The cooling unit according to claim 1, wherein the second portion of the heat pipe is thermally coupled to a supply line arranged in the cooling unit for supplying the cooling agent from the central cooling system to the heat exchanger and/or to a discharge line arranged in the cooling unit for returning the cooling agent from the heat exchanger to the central cooling system.

4. The cooling unit according to claim 1, wherein the first portion of the heat pipe is in direct or indirect contact with a casing of the power electronics, to absorb the heat from the power electronics.

5. The cooling unit according to claim 1, wherein the heat pipe has a sealed casing and the working agent is contained within the sealed casing at a predetermined pressure which is lower than atmospheric pressure such that a predetermined temperature at which heat from the power electronics is absorbed by evaporating the working agent being in the liquid phase is lower than the normal boiling point of the working agent being in the liquid phase at atmospheric pressure.

6. The cooling unit according to claim 5, wherein the predetermined pressure is set such that the temperature of the power electronics remains above a dew point of the ambient air of the power electronics.

7. The cooling unit according to claim 5, wherein the heat pipe is configured such that the working agent and/or the predetermined pressure are selectively adjustable so as to change the predetermined temperature.

8. The cooling unit according to claim 1, wherein the working agent comprises water, ethanol, acetone, sodium and/or mercury.

9. The cooling unit according to claim 5, wherein the working agent is water and the predetermined pressure is set to 0.0234 bar such that the predetermined temperature at which heat from the power electronics is absorbed by evaporating the working agent being in the liquid phase is equal to or higher than 20° C.

10. Use of the cooling unit according to claim 1 for cooling one or more heat generating devices provided on board of a means of transport.

11. A cooling system for a means of transport, wherein the cooling system comprises:
   at least one cooling unit according to claim 1 for cooling the one or more heat generating devices provided on board of the means of transport,
   at least one cooling station different from the at least one cooling unit for cooling food provided on board of the means of transport, and
   a central chiller device for generating cooling energy, wherein the chiller device is thermally coupled with the at least one cooling unit and the at least one cooling station to supply the cooling energy to the at least one cooling unit and to the at least one cooling station.

12. The cooling system according to claim 11, wherein the cooling system further comprises a cooling circuit which is thermally coupled to the chiller device to supply the cooling energy to the at least one cooling unit and to the at least one cooling station.

13. Means of transport, comprising the cooling unit according to claim 1 for cooling the one or more heat generating devices provided on board of the means of transport.

14. The means of transport according to claim 13, wherein the means of transport is an aircraft and the cooling unit is arranged on board of the aircraft such that the cooling energy in the form of cold air is supplied to In Flight Entertainment, "IFE", electronic components.

15. The means of transport according to claim 14, wherein the cooling unit is arranged at a rack carrying the IFE electronic components.

* * * * *